US012356648B2

(12) United States Patent
Chang

(10) Patent No.: US 12,356,648 B2
(45) Date of Patent: Jul. 8, 2025

(54) HIGH VOLTAGE TRANSISTOR

(71) Applicant: UNITED MICROELECTRONICS CORP., Hsin-Chu (TW)

(72) Inventor: Kai-Kuen Chang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 561 days.

(21) Appl. No.: 17/688,836

(22) Filed: Mar. 7, 2022

(65) Prior Publication Data
US 2023/0253481 A1 Aug. 10, 2023

(30) Foreign Application Priority Data
Feb. 8, 2022 (CN) .................. 202210117553.X

(51) Int. Cl.
*H10D 30/01* (2025.01)
*H01L 21/225* (2006.01)
(Continued)

(52) U.S. Cl.
CPC ..... *H10D 30/0281* (2025.01); *H01L 21/2253* (2013.01); *H01L 21/26513* (2013.01);
(Continued)

(58) Field of Classification Search
CPC . H01L 21/027; H01L 21/033; H01L 21/0334; H01L 21/308; H01L 21/3083; H01L 21/32; H01L 21/36; H01L 21/2253; H01L 21/26513; H01L 21/266; H01L 21/761; H01L 29/66681; H01L 29/0603; H01L 29/0607; H01L 29/0611; H01L 29/0619; H01L 29/0623; H01L 29/1095; H01L 29/78; H01L 29/7801; H01L 29/7811; H01L 29/7816; H01L 29/7823; H01L 29/7833; H01L 29/7835; H01L 29/08; H01L 29/0843; H01L 29/0847;
(Continued)

(56) References Cited

U.S. PATENT DOCUMENTS 8,492,834 B2 * 7/2013 Lai .................. H10D 30/603
257/E29.174
9,666,671 B2 * 5/2017 Zhang .............. H01L 29/66681
(Continued)

*Primary Examiner* — Steven B Gauthier
*Assistant Examiner* — Adam D Weiland
(74) *Attorney, Agent, or Firm* — Winston Hsu

(57) ABSTRACT

A fabricating method of a high voltage transistor includes providing a high voltage transistor. The high voltage transistor includes a substrate. A gate structure is disposed on the substrate. A source drift region and a drain drift region are respectively disposed at two sides of the gate structure and embedded within the substrate. A source is disposed in the source drift region. A drain is disposed within the drain drift region. The steps of fabricating the drain drift region include defining a drain drift region predetermined region on the substrate by using a photo mask. The photo mask includes a first comb-liked pattern. The first comb-liked pattern includes a first rectangle and numerous first tooth structures. Then, an ion implantation process is performed to implant dopants into the drain drift region predetermined region. Then, dopants in the drain drift region predetermined region are diffused to form the drain drift region.

10 Claims, 10 Drawing Sheets

(51) Int. Cl.
*H01L 21/265* (2006.01)
*H01L 21/266* (2006.01)
*H01L 21/761* (2006.01)
*H10D 30/60* (2025.01)
*H10D 30/65* (2025.01)
*H10D 62/10* (2025.01)
*H10D 62/13* (2025.01)
*H10D 62/17* (2025.01)

(52) U.S. Cl.
CPC .......... *H01L 21/266* (2013.01); *H01L 21/761* (2013.01); *H10D 30/605* (2025.01); *H10D 30/65* (2025.01); *H10D 62/106* (2025.01); *H10D 62/107* (2025.01); *H10D 62/116* (2025.01); *H10D 62/151* (2025.01); *H10D 62/393* (2025.01); *H10D 62/126* (2025.01)

(58) Field of Classification Search
CPC ............... H01L 29/0852; H01L 29/086; H01L 29/0878; H10D 30/64–669; H10D 30/028–0297; H10D 30/601–608; H10D 30/0281–0289; H10D 30/65–659; H10D 62/152–155; H10D 62/156–159
See application file for complete search history.

(56) References Cited

U.S. PATENT DOCUMENTS

| | | | |
|---|---|---|---|
| 2013/0234246 A1* | 9/2013 | Yang | H01L 21/76224 257/E29.256 |
| 2014/0203358 A1* | 7/2014 | Yang | H10D 30/603 438/286 |
| 2017/0125584 A1* | 5/2017 | Zhang | H10D 62/111 |
| 2021/0118987 A1* | 4/2021 | Yao | H01L 29/7835 |
| 2022/0115536 A1* | 4/2022 | Chen | H01L 29/66689 |

* cited by examiner

HIGH VOLTAGE TRANSISTOR

BACKGROUND OF THE INVENTION

1. Field of the Invention

The present invention relates to a high voltage transistor and more particularly to a method of forming a high voltage transistor by using a photo mask with a comb-liked pattern.

2. Description of the Prior Art

High voltage transistors are widely used in various industrial and consumer electronic equipment. For example, they are often used to construct input/output (IO) circuits, electrostatic discharge protection circuits, power amplifiers, etc. Therefore, high-voltage transistors should have high breakdown voltage to improve the working stability of the power supply circuit, and low on-resistance to improve the working efficiency of the circuit.

Generally, the current method used to increase the breakdown voltage of high voltage transistors is to adjust the edge of the drain drift region. However, this method will change a pitch of the high resistance transistor. Therefore, it is desirable to provide a high voltage transistor that can increase the breakdown voltage without changing the pitch of the high voltage transistors.

SUMMARY OF THE INVENTION

In view of this, the present invention provides a new method of fabricating a high voltage transistor including reducing the dopant concentration in part of the drain drift region, so as to increase the breakdown voltage without changing the pitch of the high-voltage transistor.

According to a first preferred embodiment of the present invention, a fabricating method of a high voltage transistor includes providing a high voltage transistor, wherein the high voltage transistor includes a substrate. A gate structure is disposed on the substrate. A source drift region and a drain drift region are respectively disposed at two sides of the gate structure and embedded within the substrate. A source is disposed in the source drift region. A drain is disposed within the drain drift region. Next, a high voltage guard ring surrounding the high voltage transistor is provided, wherein the high voltage guard ring is disposed within the substrate. The steps of fabricating the drain drift region includes defining a drain drift predetermined region on the substrate by using a photo mask, wherein the photo mask includes a first comb-liked pattern, the first comb-liked pattern includes a first rectangle and a plurality of first tooth structures. An ion implantation process is performed to implant dopants into the drain drift predetermined region. Finally, dopants in the drain drift predetermined region are diffused to form the drain drift region.

According to a second preferred embodiment of the present invention, a high voltage transistor includes a substrate. A gate structure is disposed on the substrate. A source drift region and a drain drift region are respectively disposed at two sides of the gate structure and embedded in the substrate. A source is disposed within the source drift region. A drain is disposed within the drain drift region. A first direction is defined as extending from the source toward the drain, a second direction is perpendicular to the first direction, the drain drift region is divided into a first region and a second region along the first direction, and a dopant concentration within the first region is greater than a dopant concentration within the second region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
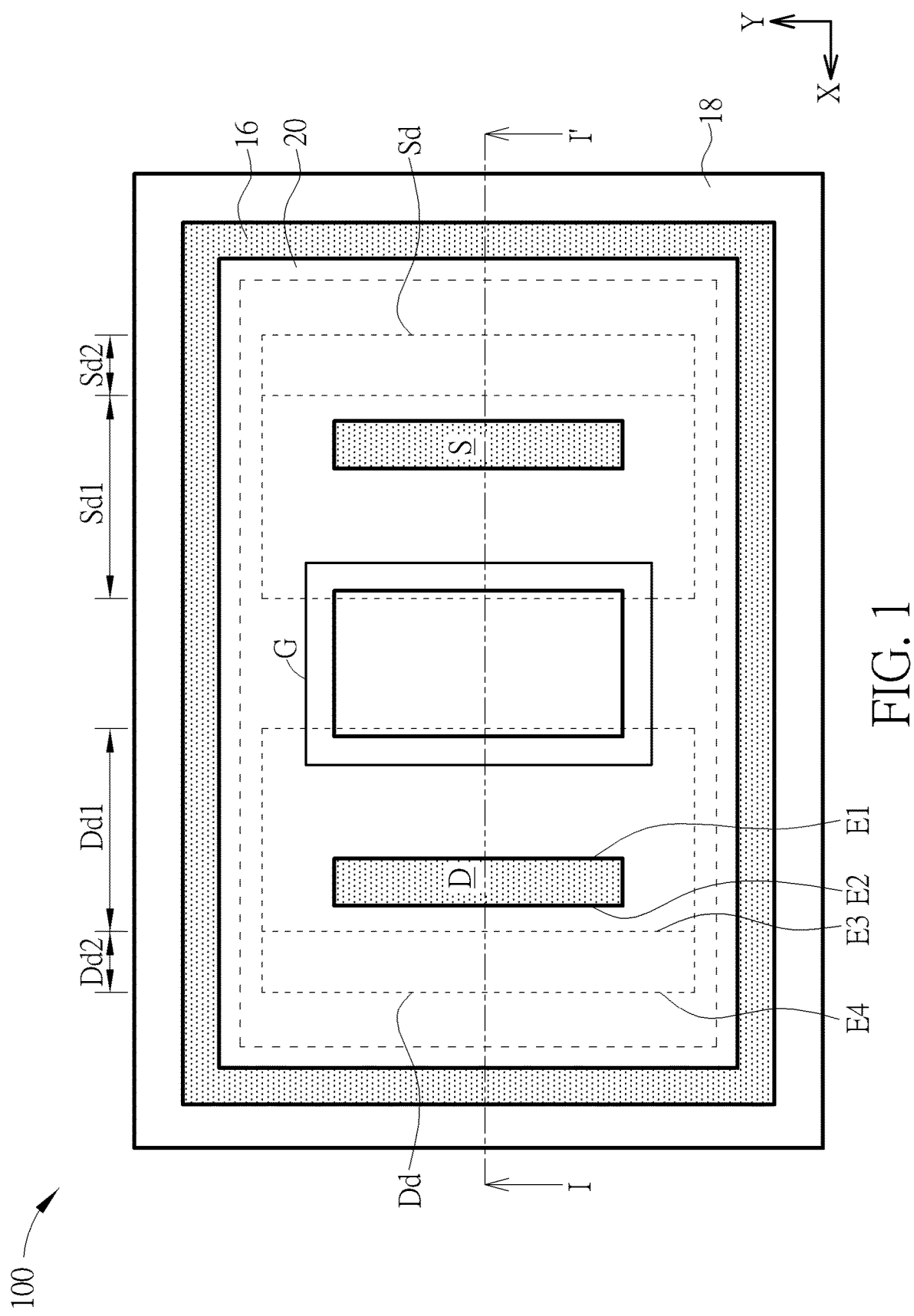
FIG. 1 depicts a top view of a high voltage transistor according to a first preferred embodiment of the present invention.
Figure 2:
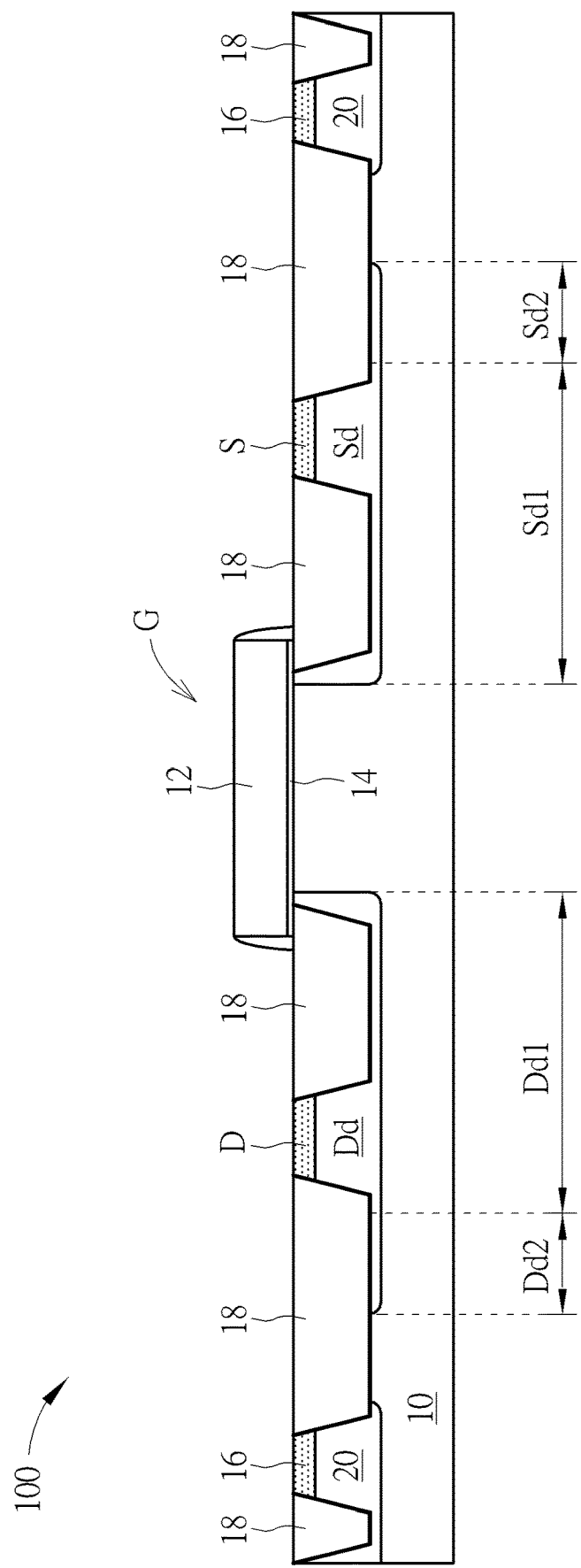
FIG. 2 depicts a sectional view along a line I-I' in FIG. 1.
Figure 3:
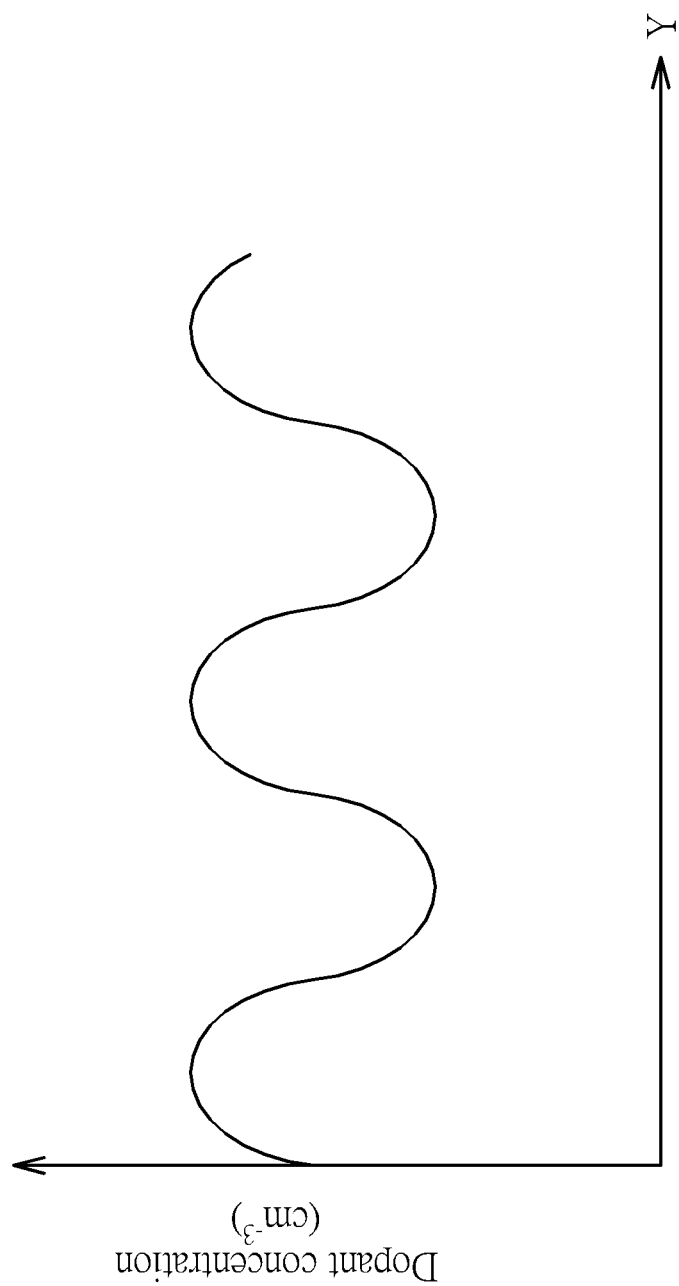
FIG. 3 depicts a dopant concentration vs. a second region along a second direction.
Figure 4:
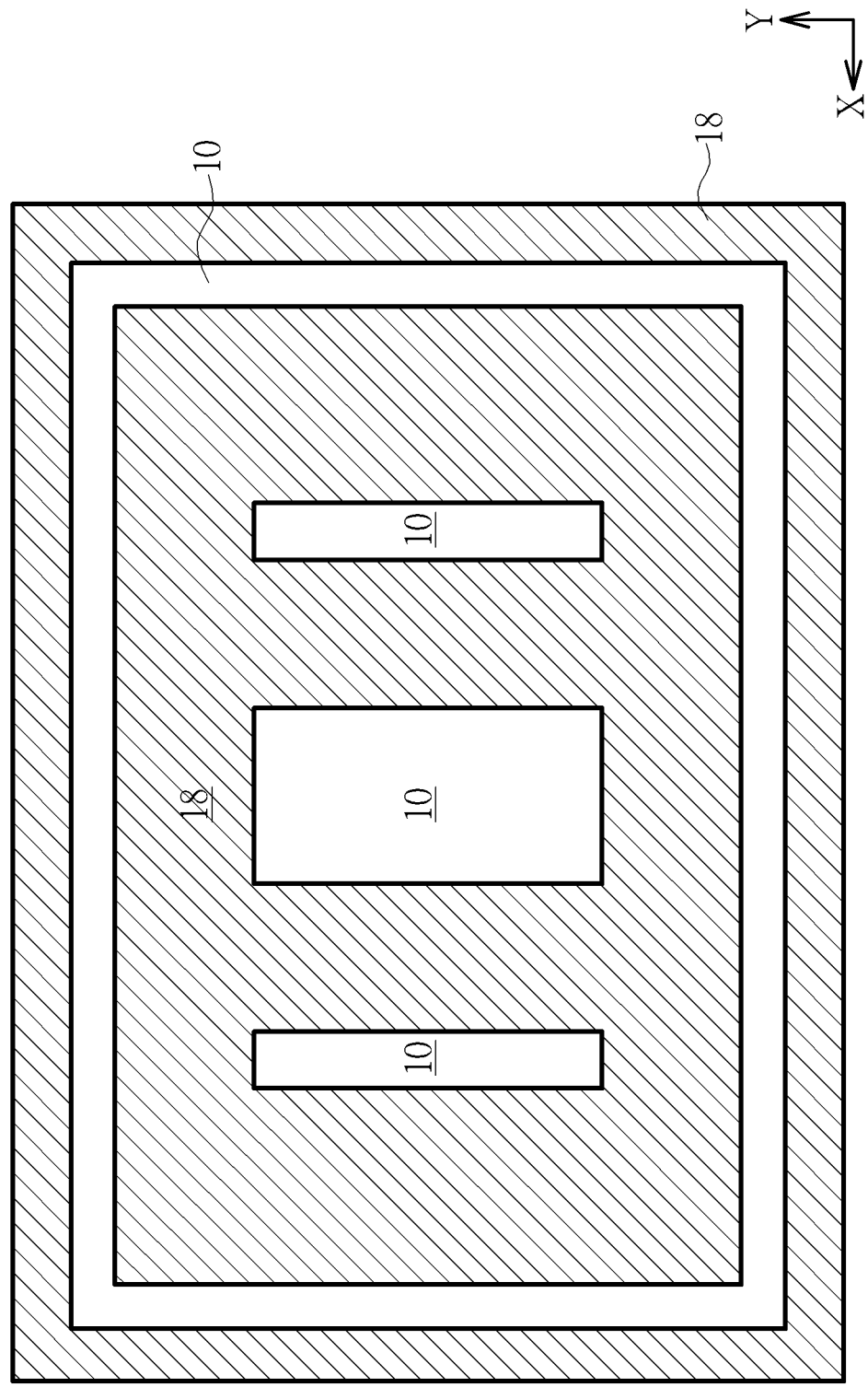
FIG. 4 to FIG. 7 depicts a fabricating method of a high voltage transistor in the first preferred embodiment.

FIG. 1 depicts a top view of a high voltage transistor according to a first preferred embodiment of the present invention. FIG. 2 depicts a sectional view along a line I-I' in FIG. 1. FIG. 3 depicts a dopant concentration vs. a second region along a second direction. FIG. 4 depicts a position of a shallow trench isolation on a substrate of FIG. 1.

As shown in FIG. 1 and FIG. 2, a high voltage transistor 100 includes a substrate 10. A doped well (not shown) is disposed within the substrate 10. A gate structure G is disposed on the substrate 10. The gate structure G includes a gate 12 and a gate dielectric layer 14 disposed between the gate 12 and the substrate 10. The gate 12 can be a polysilicon gate or a metal gate. A source drift region Sd and a drain drift region Dd are respectively disposed at two sides of the gate structure G and embedded within the substrate 10. A source S is disposed in the source drift region Sd. A drain D is disposed within the drain drift region Dd. A first direction X is defined as extending from the source S toward the drain D. A second direction Y is perpendicular to the first direction X. The first direction X and the second direction Y are parallel to a top surface of the substrate 10. The drain drift region Dd is divided into a first region Dd1 and a second region Dd2 along the first direction X. A dopant concentration within the first region Dd1 is greater than a dopant concentration within the second region Dd2. The second region Dd2 is farther from the gate structure G than the first region Dd1 is. The first region Dd1 and the second region Dd2 in FIG. 1 are divided by dotted lines.

Moreover, a high voltage guard ring 16 surrounds the high voltage transistor 100, wherein the high voltage guard ring 16 is disposed within the substrate 10. Please refer to FIG. 1, FIG. 2 and FIG. 4, the shallow trench isolation 18 surrounds the source S, the drain D and the high voltage guard ring 16. In addition, part of the source drift region Sd and part of the drain drift region Dd respectively extend to be under the shallow trench isolation 18 and to be at a side of the shallow trench isolation 18. A high voltage doped well 20 overlaps the high voltage guard ring 16, and the high voltage doped well 20 extends to be under the shallow trench isolation 18.

Furthermore, the drain D has a first edge E1 and a second edge E2 along the second direction Y. The second edge E2 is farther from the gate structure G, and the first edge E1 is closer to the gate structure G. The second region Dd2 has a third edge E3 and a fourth edge E4 along the second direction Y. The fourth edge E4 is farther from the gate structure G, and the third edge E3 is closer to the gate structure G. The first edge E1, the second edge E2, the third edge E3 and the fourth edge E4 are defined by the positions of the drain D and the drain drift region Dd in the substrate 10 rather than in the shallow trench isolation 18. It is noteworthy that the third edge E3 is farther from the gate structure G than the first edge E1 is. That is, the second region Dd2 of the drain drift region Dd does not overlap the drain D entirely. If the second region Dd2 of the drain drift region Dd overlaps the drain D entirely, the location below the drain D will be disposed by the second region Dd2 which has a lower dopant concentration. In this way, the on-resistance of the high voltage transistor 100 will be influenced. FIG. 1 is exemplified by shown that the third edge E3 is farther from the gate structure G than the second edge E2 is. However, the position of the third edge E3 can be altered based on the criteria that the third edge E3 is farther from the gate structure G than the first edge E1 is.

The source S, the source drift region Sd, the drain D and the drain drift region Dd have a first conductive type. The high voltage doped well 20 and the high voltage guard ring 16 have a second conductive type. The first conductive type is different from the second conductive type. For example, when the high voltage transistor 100 is an N-type transistor, the first conductive type is N-type, and the second conductive type is P-type. When the high voltage transistor 100 is a P-type transistor, the first conductive type is P-type, and the second conductive type is N-type. The high voltage transistor 100 of the present invention can be an N-type transistor or a P-type transistor. Moreover, the dopant concentration of the source S is greater than the dopant concentration of the source drift region Sd. The dopant concentration of the drain D is greater than the dopant concentration of the drain drift region Dd. The dopant concentration of the high voltage guard ring 16 is greater than the dopant concentration of the high voltage doped well 20.

The dopant concentration of the second region Dd2 of the drain drift region Dd is specially decreased to increase the breakdown voltage of the PN junction formed by the second region Dd2 and the high voltage doped well 20. In this way, the high voltage transistor 100 can sustain higher voltage.

As shown in FIG. 3 and FIG. 1, a dopant concentration along the second direction Y in the second region Dd2 changes in a way from high to low and then from low to high. That is, a dopant concentration along the second direction Y in the second region Dd2 changes in a way like wave. This wave-liked change is caused by fabricating processes which will be described afterwards.

Furthermore, the high voltage transistor 100 in the first preferred embodiment is symmetric. That is, the source draft region Sd and the drain drift region Dd have the same structure. Therefore, the source draft region Sd is divided into a third region Sd1 and a fourth region Sd2. The dopant concentration of the third region Sd1 is greater than the dopant concentration of the fourth region Sd2. The third region Sd1 is closer to the gate structure G, and the fourth region Sd2 is farther from the gate structure G.

Figure 9:
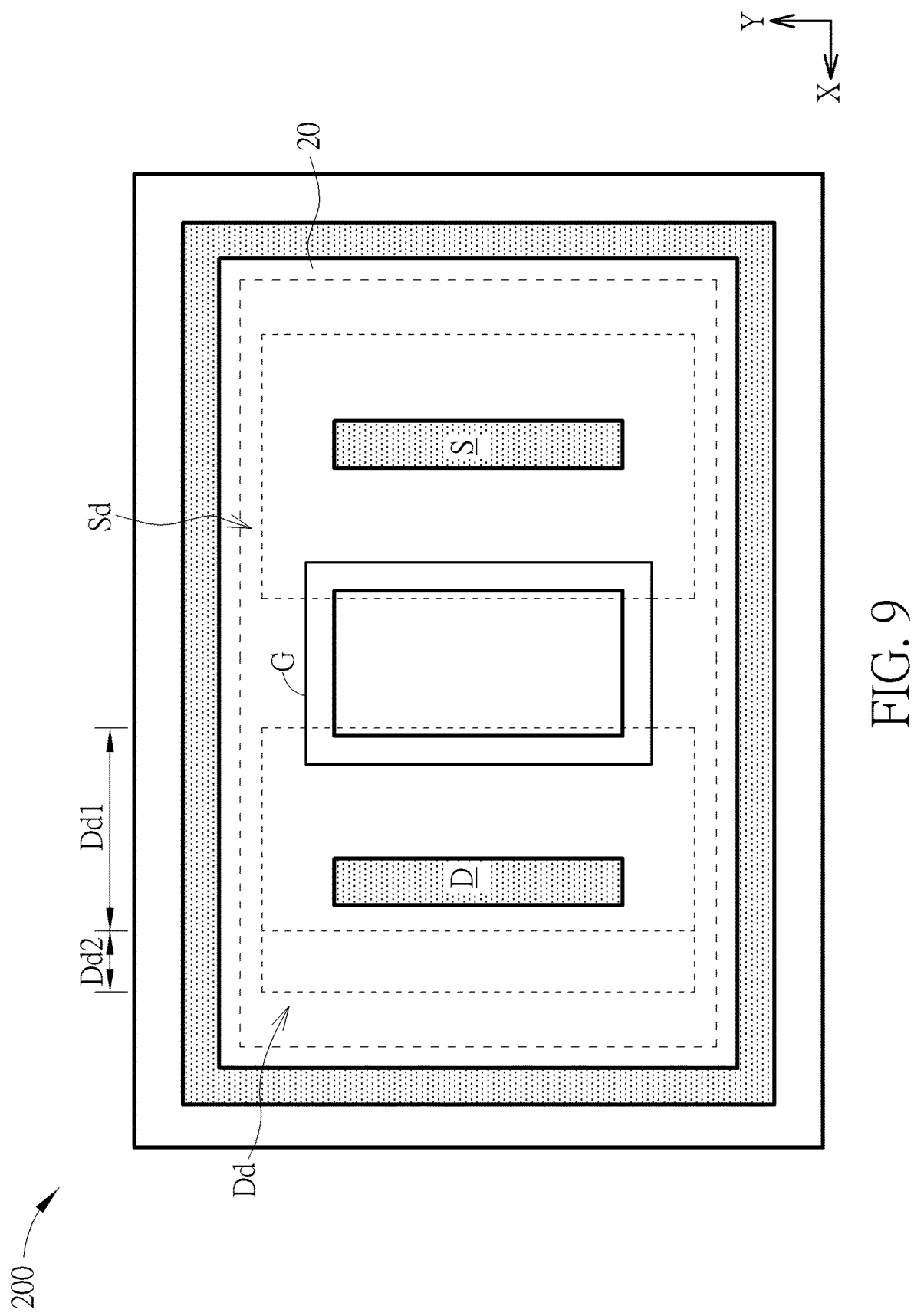
FIG. 9 depicts a top view of a high voltage transistor according to a second preferred embodiment of the present invention.
Figure 10:
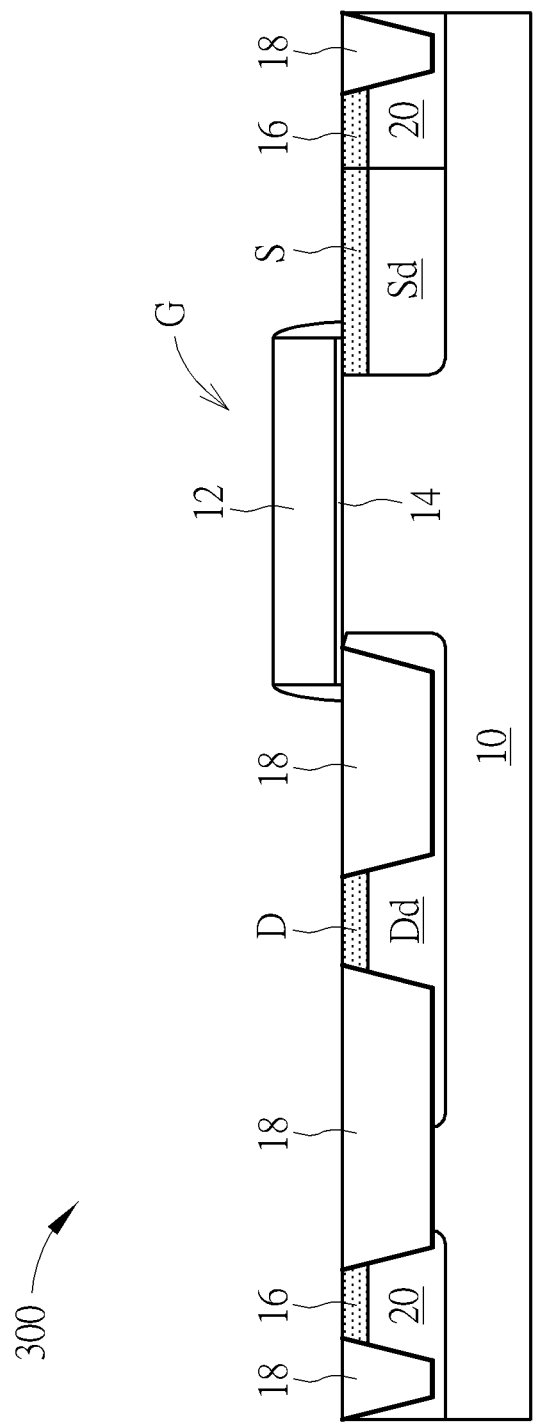
FIG. 10 depicts a sectional view of a high voltage transistor according to a third preferred embodiment of the present invention.

FIG. 9 depicts a top view of a high voltage transistor according to a second preferred embodiment of the present invention, wherein like reference numerals are used to refer to like elements throughout. FIG. 10 depicts a sectional view of a high voltage transistor according to a third preferred embodiment of the present invention, wherein like reference numerals are used to refer to like elements throughout.

As shown in FIG. 9, the high voltage transistor 200 of the second preferred embodiment is asymmetrical. The dopant concentration of the entire source drift region Sd is the same. Other elements in the second preferred embodiment are the same as those in the first preferred embodiment. The high voltage transistor 300 of the third preferred embodiment is also asymmetrical. Please also refer to FIG. 2, in the high voltage transistor 300, if the gate structure G serves as center, the elements which are at the same side as the drain D are at the same position as the elements in the first preferred embodiment. For example, the drain D, the drain drift region Dd, the shallow trench isolation 18, the high voltage guard ring 16, the high voltage doped well 20 in the high voltage transistor 300 are at the same position as those in the high voltage transistor 100. The elements at the same side as the source S in the high voltage transistor 300 have positions and structures different from those in the high voltage transistor 100. In details, in the third embodiment, there is no shallow trench isolation 18 between the source drift region Sd and the high voltage doped well 20. Furthermore, the dopant concentration of the entire source drift region Sd is the same. On the other hand, there are elements the same as those in the high voltage transistor 100. For example, the drain drift region Dd of the high voltage transistor 300 also has the first region Dd1 and the second region Dd2. The dopant concentration of the second region Dd2 is smaller than the dopant concentration of the first region Dd1.

FIG. 4 to FIG. 7 depicts a fabricating method of a high voltage transistor in the first preferred embodiment, wherein elements which are substantially the same as those in the first preferred embodiment are denoted by the same reference numerals; an accompanying explanation is therefore omitted. As shown in FIG. 4, a substrate 10 is provided. Then a doped well (not shown) is formed in the substrate 10. Later, a shallow trench isolation 18 is formed in the substrate 10. The region of the substrate 10 without the shallow trench isolation 18 is defined as an active region. In order to show clearly the positions of the shallow trench isolation 18 and the active region, the shallow trench isolation 18 is marked with slashes. However, in other figures the slashes are removed in order to show other elements clearly.

Figure 5:
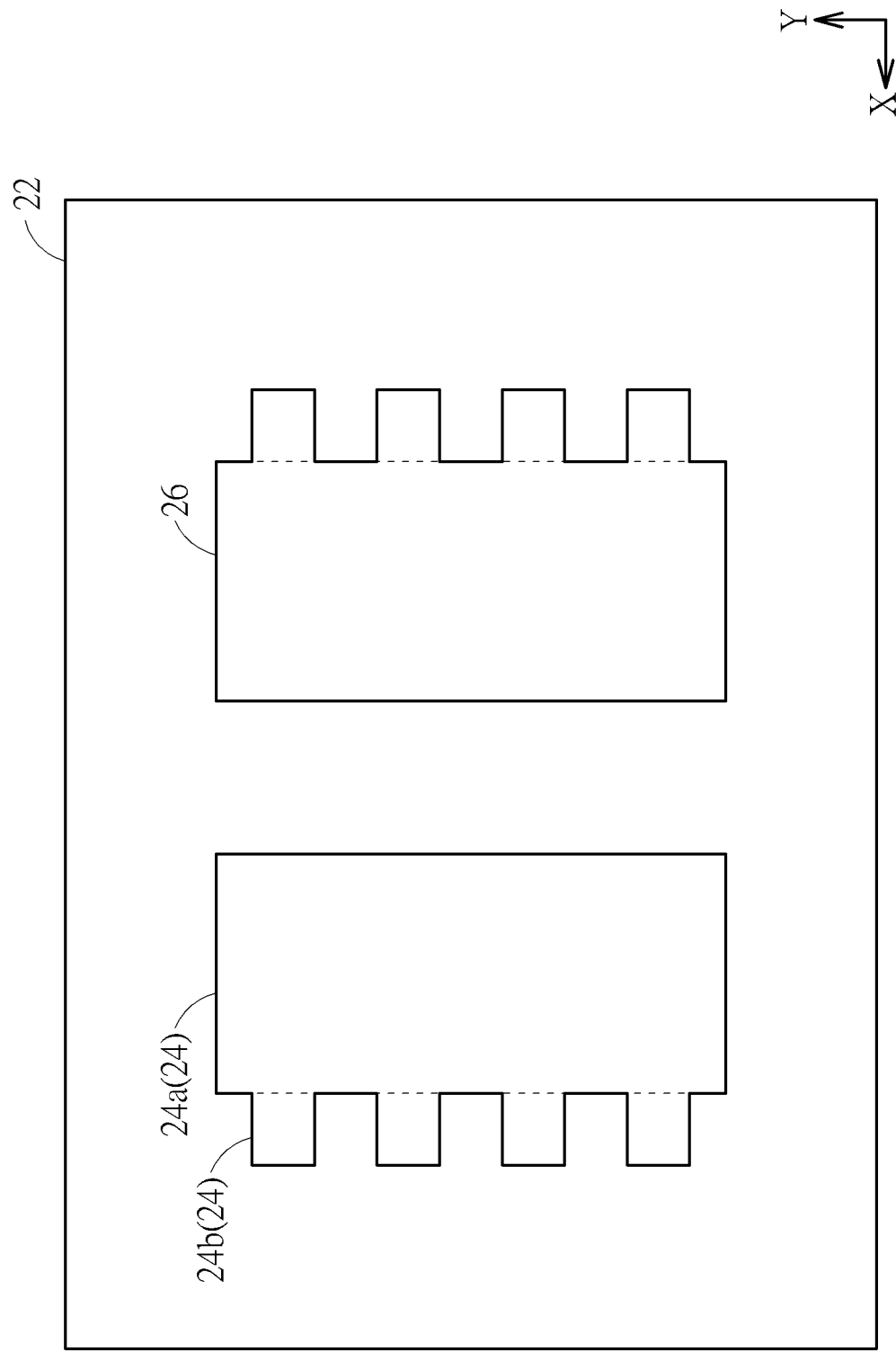
Figure 6:
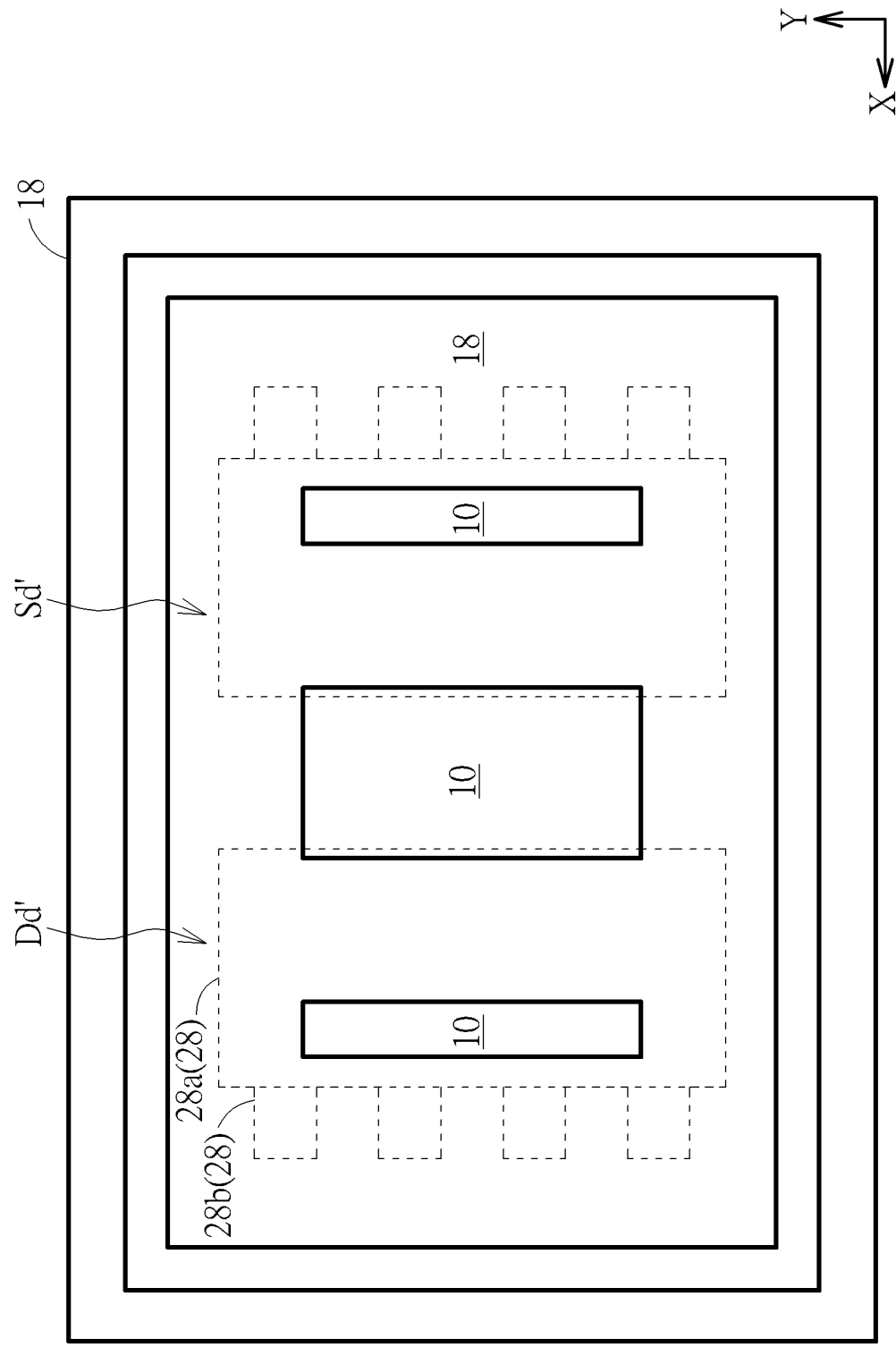

As shown in FIG. 5, a photo mask 22 is provided. The photo mask 22 includes a first comb-liked pattern 24 and a third comb-liked pattern 26. The first comb-liked pattern 24 includes a first rectangle 24a and numerous first tooth structures 24b. Later, as shown in FIG. 5 and FIG. 6, a drain drift predetermined region Dd' is defined on the substrate 10 by using the first comb-liked pattern 24a on the photo mask 22, and a source drift predetermined region Sd' is defined on the substrate 10 by using the third comb-liked pattern 26 on the a photo mask 22. The steps of defining the drain drift predetermined region Dd' and the source drift predetermined region Sd' can include utilizing a lithographic process and an exposure and development process to form a patterned photoresist (not shown) which defines positions of the drain drift predetermined region Dd' and the source drift predetermined region Sd' on the substrate 10.

Figure 7:
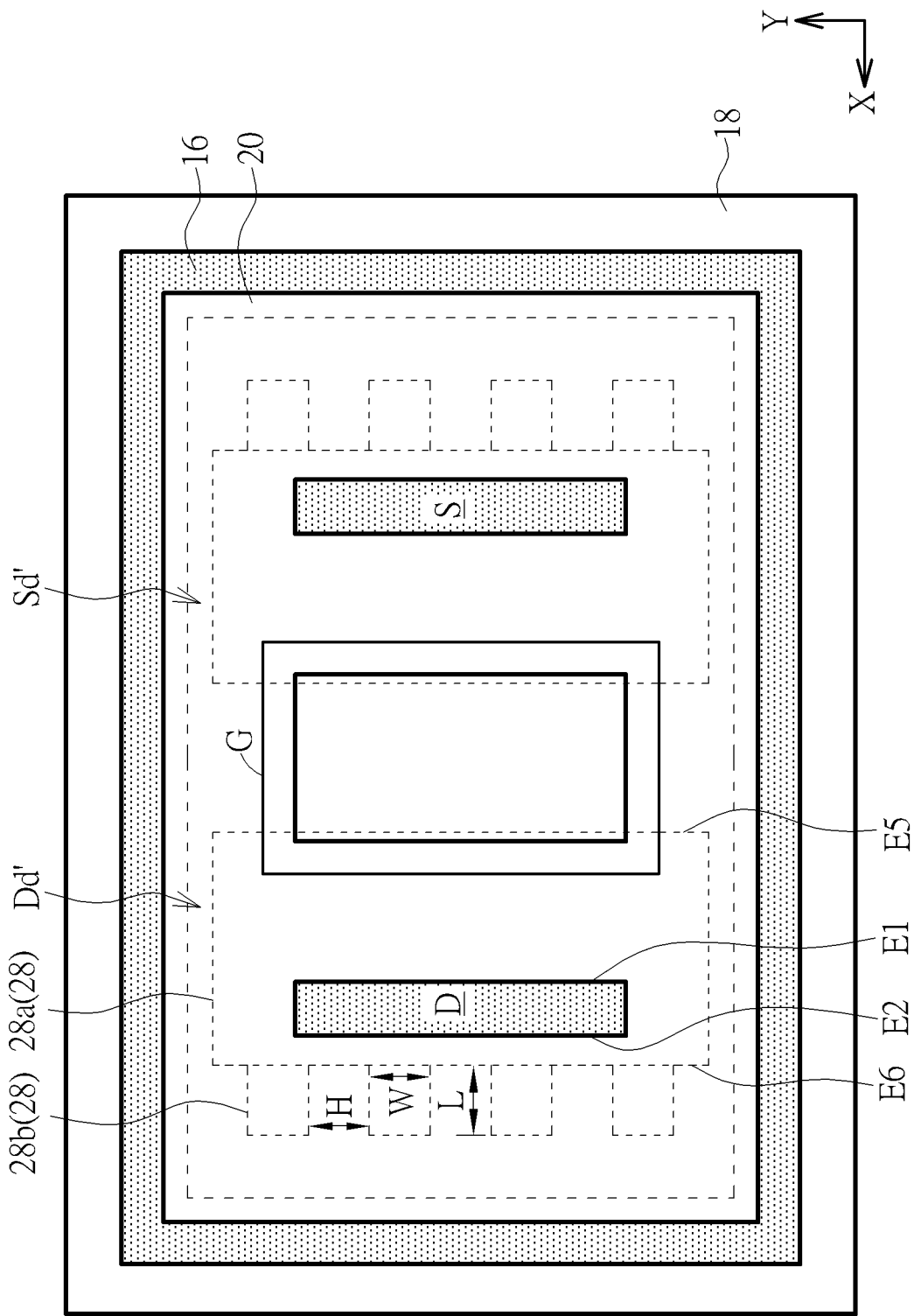

Later, as shown in FIG. 6, an ion implantation process is performed to implant dopants into the drain drift predetermined region Dd' and the source drift predetermined region Sd'. Next, as shown in FIG. 7, a high voltage doped well 20 is formed to surround the source drift predetermined region Sd' and the drain drift predetermined region Dd'. Subsequently, a high voltage guard ring 16 is formed within the high voltage doped well 20. The fabricating sequence of the step of forming the source drift predetermined region Sd' and the drain drift predetermined region Dd' can be exchanged with the step of forming the high voltage guard ring 16 and the high voltage doped well 20. After that, a gate structure G is formed between the drain drift predetermined region Dd' and the source drift predetermined region Sd'. Next, a source S and a drain D are formed simultaneously. The source S is disposed within the active region of the source drift predetermined region Sd'. The drain D is disposed within the active region of the drain drift predetermined region Dd'.

Moreover, a first direction X is defined as extending from the source S toward the drain D. A second direction Y is perpendicular to the first direction X. The drain drift predetermined region Dd' includes a second comb-like pattern 28. The second comb-like pattern 28 includes a second rectangle 28a and numerous second tooth structures 28b. The second rectangle 28a and the second tooth structures 28b are divided by dotted lines. The second rectangle 28a has a fifth edge E5 along the second direction Y and a sixth edge E6 along the second direction Y. The fifth edge E5 is opposed to the sixth edge E6. The sixth edge E6 is farther from the gate structure G than the fifth edge E5 is, and the second tooth structures 28b are disposed on the sixth edge E6.

Each of the second tooth structures 28b has a width W. The width W of each of the second tooth structures 28b is the same. A distance H is disposed between the adjacent second tooth structures 28b. The distance H/width W may be between 0.5 and 2. The distance H can be between 0.5 and 1.2 μm. The width W can be between 0.5 and 1.2 μm According to a preferred embodiment of the present invention, the high voltage transistor 100 performs better when the width W equals to the distance H. Moreover, each of the second tooth structures 28b has a length L extends from the sixth Edge E6 along the first direction X. The length L can be between 0.2 and 1 μm.

Furthermore, the drain D has a first edge E1 along the second direction Y and a second edge E2 along the second direction Y. The second edge E2 is farther from the gate structure G than the first edge E1 is. Along the first direction X, the sixth edge E6 is farther from the gate structure G than the first edge E1 is. Although in this embodiment, only the outline of the drain drift predetermined region Dd' is described, however, the outline of the source drift predetermined region Sd' is the same as that of the drain drift predetermined region Dd'.

As shown in FIG. 1 and FIG. 7, after an annealing process, the dopants in the drain drift predetermined region Dd' and in the source drift predetermined region Sd' are diffused. Therefore, the dopants in the second tooth structures 28b and in the source drift predetermined region Sd' are distributed uniformly into the adjacent substrate 10. Now, the drain drift predetermined region Dd' is transformed into a drain drift region Dd. The source drift predetermined region Sd' is transformed into a source drift region Sd. Moreover, as shown in FIG. 3, the position where the dopant concentration is the highest corresponds to the middle of one of the second tooth structures 28b in FIG. 7. Dopants are laterally diffused from the middle of one of the second tooth structures 28b so as to form the position where the dopant concentration is lower. The dopant concentration along the second direction Y in the second region Dd2 can be uniformed by adjusting the temperature and time of the dopant diffusion. Moreover, although there is part of the drain drift predetermined region Dd' in the shallow trench isolation 18, the fifth edge E5 and the sixth Edge E6 are defined by edges formed by the dopants within the substrate 10 because dopants can be conductive in the substrate 10 but not in the shallow trench isolation 18.

Figure 8:
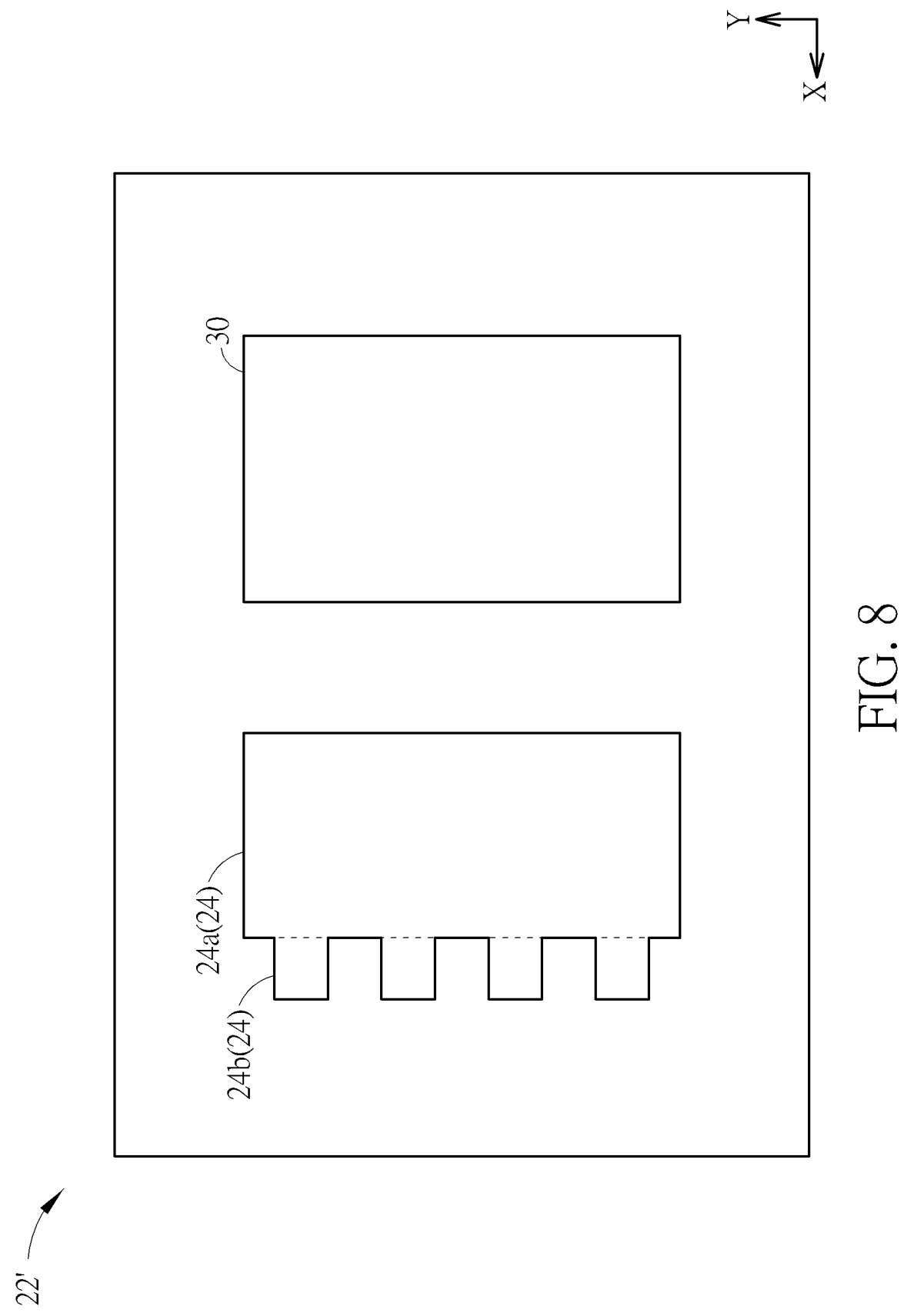
FIG. 8 depicts a fabricating process of a high voltage transistor according to a second preferred embodiment of the present invention.

FIG. 8 depicts a fabricating process of a high voltage transistor according to a second preferred embodiment of the present invention, wherein elements which are substantially the same as those in the first preferred embodiment are denoted by the same reference numerals; an accompanying explanation is therefore omitted. The difference between the first preferred embodiment and the second preferred embodiment is that the photo mask 22' in the second preferred embodiment has numerous first tooth structures 24b corresponding to the drain drift predetermine region Dd', but a conventional rectangular 30 corresponding to the source drift predetermine region Sd'. Other steps in the second preferred embodiment are the same as those in the first preferred embodiment. After applying the photo mask 22' and diffusing the dopants by an annealing process, a high voltage transistor 200 in FIG. 9 can be completed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high voltage transistor, comprising:
   a substrate;
   a gate structure disposed on the substrate;
   a source drift region and a drain drift region respectively disposed at two sides of the gate structure and embedded in the substrate;
   a source disposed within the source drift region; and
   a drain disposed within the drain drift region;
   wherein a first direction is defined as extending from the source toward the drain, a second direction is perpendicular to the first direction, the drain drift region is divided into a first region and a second region along the first direction, a dopant concentration within the first region is greater than a dopant concentration within the second region, and as seen from a top view, a boundary of the second region which has the dopant concentration smaller than the dopant concentration of the first region is an end of the drain drift region, and the boundary is a furthest lateral side of the second region from a start of the drain drift region.

2. The high voltage transistor of claim 1, wherein the second region is farther from the gate structure than the first region is.

3. The high voltage transistor of claim 1, further comprising:
   a high voltage guard ring surrounding the high voltage transistor, wherein the high voltage guard ring is disposed within the substrate;
   a shallow trench isolation surrounding the source, the drain and the high voltage guard ring; and
   a high voltage doped well overlapped the high voltage guard ring, and the high voltage doped well extending to be under the shallow trench isolation.

4. The high voltage transistor of claim 3, wherein the source drift region and the drain drift region have a first conductive type, the high voltage doped well and the high voltage guard ring have a second conductive type, and the first conductive type is different from the second conductive type.

5. The high voltage transistor of claim 1, wherein the drain has a first edge and a second edge along the second direction, the second edge is farther from the gate structure than the first edge is, the second region has a third edge and a fourth edge along the second direction, the fourth edge is farther from the gate structure than the third edge is, the third edge is farther from the gate structure than the first edge is.

6. The high voltage transistor of claim 1, wherein a dopant concentration along the second direction in the second region changes in a way from high to low and then from low to high.

7. A high voltage transistor, comprising:
   a substrate;
   a gate structure disposed on the substrate;
   a source drift region and a drain drift region respectively disposed at two sides of the gate structure and embedded in the substrate;
   a source disposed within the source drift region; and
   a drain disposed within the drain drift region;
   wherein a first direction is defined as extending from the source toward the drain, a second direction is perpendicular to the first direction, the drain drift region is divided into a first region and a second region along the first direction, a dopant concentration within the first region is greater than a dopant concentration within the second region, and wherein a dopant concentration along the second direction in the second region changes in a way from high to low and then from low to high, and an entirety of the second region does not directly contact the drain.

8. The high voltage transistor of claim 7, wherein the second region is farther from the gate structure than the first region is.

9. The high voltage transistor of claim 7, further comprising:
   a high voltage guard ring surrounding the high voltage transistor, wherein the high voltage guard ring is disposed within the substrate;
   a shallow trench isolation surrounding the source, the drain and the high voltage guard ring; and
   a high voltage doped well overlapped the high voltage guard ring, and the high voltage doped well extending to be under the shallow trench isolation.

10. The high voltage transistor of claim 9, wherein the source drift region and the drain drift region have a first conductive type, the high voltage doped well and the high voltage guard ring have a second conductive type, and the first conductive type is different from the second conductive type.

* * * * *